United States Patent
Shakeri et al.

(10) Patent No.: US 8,467,243 B1
(45) Date of Patent: Jun. 18, 2013

(54) NVSRAM WITH INVERTED RECALL

(75) Inventors: Kaveh Shakeri, San Jose, CA (US); Jay Ashokkumar, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 379 days.

(21) Appl. No.: 12/888,737

(22) Filed: Sep. 23, 2010

Related U.S. Application Data

(60) Provisional application No. 61/246,519, filed on Sep. 28, 2009, provisional application No. 61/246,520, filed on Sep. 28, 2009.

(51) Int. Cl.
*G11C 11/34* (2006.01)

(52) U.S. Cl.
USPC .......... 365/185.08; 365/154; 365/189.15

(58) Field of Classification Search
USPC .............. 365/185.08, 154, 189.15
See application file for complete search history.

(56) References Cited

U.S. PATENT DOCUMENTS

| | | | | |
|---|---|---|---|---|
| 5,488,579 A | * | 1/1996 | Sharma et al. | 365/185.08 |
| 5,602,776 A | * | 2/1997 | Herdt et al. | 365/185.08 |
| 6,469,930 B1 | * | 10/2002 | Murray | 365/185.08 |
| 6,556,487 B1 | * | 4/2003 | Ratnakumar et al. | 365/185.08 |

* cited by examiner

*Primary Examiner* — Vu Le
*Assistant Examiner* — Han Yang

(57) ABSTRACT

A process of operating a memory circuit involves RECALL-ing a state of a volatile memory cell from a nonvolatile memory cell, and inverting an output of the volatile memory cell after every other RECALL.

20 Claims, 6 Drawing Sheets

NVSRAM WITH INVERTED RECALL

PRIORITY CLAIM

This application claims priority under 35 U.S.C. 119 to USA provisional application No. 61/246,519 filed on Sep. 28, 2009. This application also claims priority under 35 U.S.C. 119 to USA provisional application No. 61/246,520 filed on Sep. 28, 2009, each of which is incorporated herein by reference.

TECHNICAL FIELD

The present disclosure relates to machine memory technologies.

BACKGROUND

Static random access memory (SRAM) is often implemented using a bistable transistor flip-flop or latching circuit. The word "static" indicates that the memory retains its contents as long as power remains applied. "Random access" means that locations in the memory can be written to or read from in any order, regardless of the memory location that was accessed last.

SRAMs offer advantages including reliability and fast reading and writing of the stored data. The data retained in the SRAM cell is volatile. Interruption of the power supply source causes loss of the data in the SRAM cell.

A non-volatile SRAM (nvSRAM) includes an SRAM cell coupled with a nonvolatile memory cell. The nonvolatile cell may be implemented in different ways, for example using a Silicon Oxide Nitride Oxide Silicon (SONOS) transistor or a floating gate transistor with stored charge that modifies the transistor's voltage threshold. Data stored in a nonvolatile memory cell is not lost upon interruption of power.

FIG. 1 illustrates an embodiment of a conventional nvSRAM cell. The cell 100 comprises a volatile cell 106 and nonvolatile cell 101. Volatile charge is stored in the volatile cell 106 at nodes 118 and 116. Trigates 102, 104 of the nonvolatile cell 101 store nonvolatile charge via SONOS transistors 110, 112.

The nvSRAM device 100 is illustrated as having a single nvSRAM memory cell (in this case, the single SRAM 106 and a single non-volatile memory cell 101), but it should be appreciated that an nvSRAM device typically includes a plurality of nvSRAM cells that are integrated with a controller onto a semiconductor chip to form an array. Generally, an nvSRAM cell 100 comprises transistors, capacitors, and resistors. Not all elements are necessarily illustrated due to being unnecessary for an explanation or understanding of the circuit and its operation. It should be appreciated that various types of transistors, such as n-channel and p-channel FETs, and combinations of different types of transistors, may be utilized.

The SRAM cell 106 is capable, as long as power is being provided, of receiving a bit of data from an exterior environment, retaining the bit of data, and transmitting the bit of data back to the exterior environment. If power is removed from the SRAM cell 106, the SRAM cell 106 will lose the bit of data. The nonvolatile cell 101 prevents loss of the bit of data by providing the capability to receive the bit of data from the SRAM cell 106, retain the bit of data in the absence of power being provided to the SRAM cell 106, and return the bit of data to the SRAM cell 106 when power is restored. Returning a bit of data from the NV cell 101 to the SRAM cell 106 is referred to as a RECALL operation.

FIG. 1 illustrates a six transistor SRAM cell 106. The SRAM cell 106 typically has three states: standby, writing and reading. WRITE and READ procedures for an SRAM cell 106 are well known and will not be described herein.

In the standby state, the circuit is idle. The word line WL is not asserted and so transistors 120, 122 disconnect the SRAM cell 106 from the bit lines BT and BC. The first cross coupled inverter formed by transistors 124, 126 and the second cross coupled inverter formed by transistors 128, 130 continue to reinforce each other and the data stored in the cell 106 remains at nodes 116 and 118 remains stable.

The nonvolatile portion 101 includes SONOS FETs 110, 112 for nonvolatile storage of the state of the SRAM cell 106. It should be appreciated that the SONOS FETs 110, 112 can be replaced with other types of nonvolatile storage elements, such as silicon nitride oxide semiconductor (SNOS) transistors, floating gate transistors, ferroelectric transistors, and capacitors to name a few.

The FETs 114 function to connect the nonvolatile portion 101 to the volatile portion 106 during STORE and RECALL operations and to otherwise disconnect the nonvolatile portion 101 from the volatile portion 106. The FETs 108 function to connect the nonvolatile portion 101 to VCCT during a RECALL operation and to disconnect the nonvolatile portion 101 from VCCT during a STORE operation. The FETs 108 are controlled by a VRCL signal that is applied to the gates of the FETs. The control signals on the VRCL, VSE, VSTR and word lines WL are provided by a device control unit (not shown).

The transfer of data from the volatile section 106 to the non-volatile section 101, i.e. a STORE operation, takes place in two steps, during which the word line, WL, is OFF (e.g. 0V). During the first (ERASE) portion of the STORE operation, nonvolatile control lines VSTR and VRCL are OFF (e.g., 0V). By pumping a voltage on VSE, the gates of SONOS transistors 110, 112 are reduced to a relatively large negative voltage (e.g., −10V) sufficient to positively charge the nitride dielectric through direct tunneling across the tunnel oxide. The erase portion of the STORE is completed by discharging VSE back to ground.

During the second (PROGRAM) portion of the STORE operation, the state of the volatile cell 106 is stored by the nonvolatile portion 101. Assume the SRAM cell 106 stores a logic "1". This means node 118 (i.e., DT) is HIGH (e.g., 1.8V) and node 116 (i.e., DC) is LOW (e.g., 0V). A programming signal of approximately 10V is applied on VSE. A voltage higher than Vt of transistors 114 and 115 is applied to VSTR. Transistor 114 has gate and source voltages both HIGH and is thus cutoff. Transistor 115 has a HIGH gate voltage and a LOW source voltage and is thus ON. The SONOS transistor 112 corresponding to node 116 (i.e., DC) gets programmed as electrons tunnel into the nitride and get stored, thus raising the threshold voltage of this SONOS transistor 112. The SONOS transistor 110 on the DT side (i.e., node 118) of the SRAM cell 106 stays erased.

A RECALL operation begins by clearing the existing SRAM data, first by discharging the bit lines, BT and BC to ground, clamping VCCI to VSSI and then by turning ON the word line, WL. The volatile bit nodes 118 and 116 are discharged to ground. WL is then turned OFF. VSTR and VRCL are turned on, providing a charging path from VCCT to the volatile bit nodes 118 and 116 through the nonvolatile section 101. VSE is set LOW. Assuming the last STORE operation left SONOS transistor 110 erased and SONOS transistor 112 programmed (see the description of STORE, supra), and assuming that the erase threshold is −1V and the program threshold is +1V, the SONOS transistor 110 will conduct current while the SONOS transistor 112 will not because its gate voltage is below its threshold voltage $V_T$. Node 118 charges up HIGH, while node 116 remains LOW, thereby recalling the state retained by the last STORE operation. The RECALL operation is completed by powering up the SRAM and returning all control lines to their default states.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Preliminaries

Figure 1:
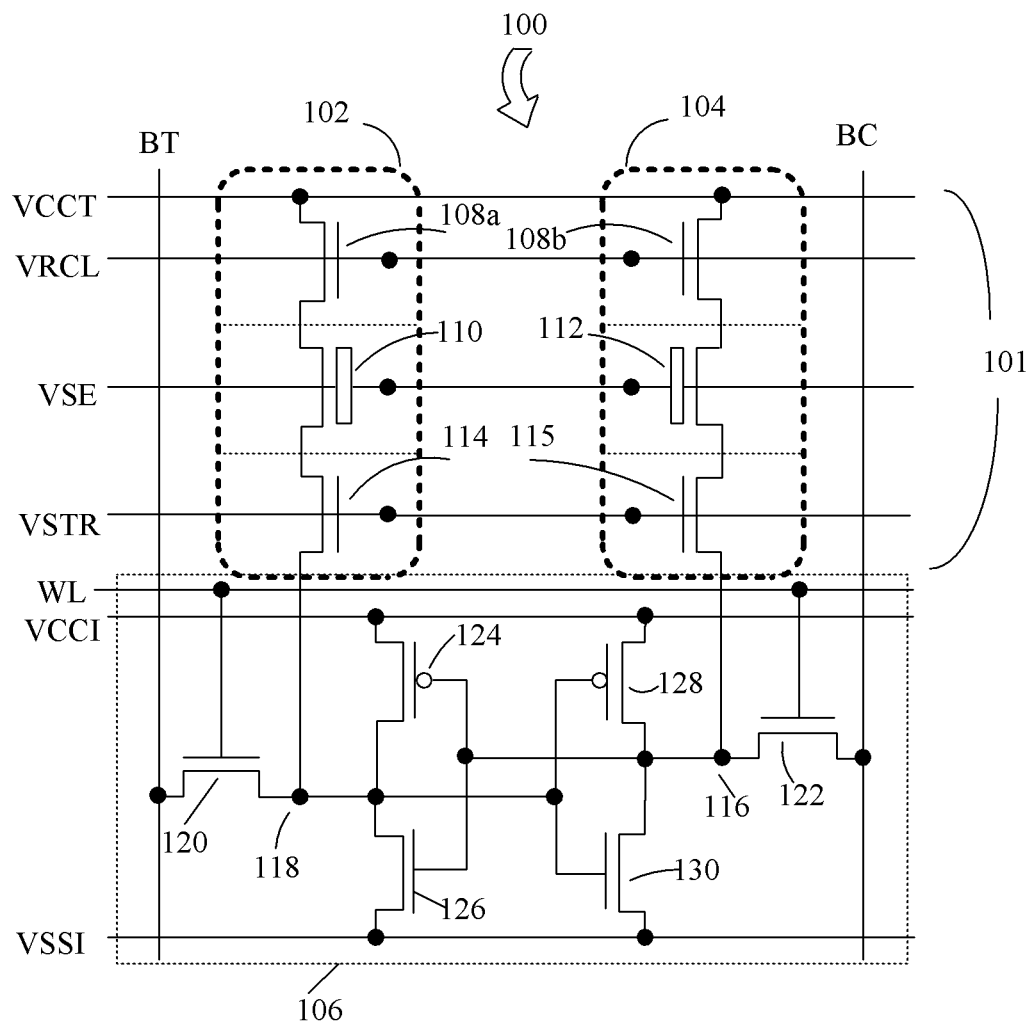
FIG. 1 illustrates a twelve transistor nvSRAM cell.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application.

"Logic" refers to machine memory circuits, machine readable media, and/or circuitry which by way of its material and/or material-energy configuration comprises control and/or procedural signals, and/or settings and values, that may be applied to influence the operation of a device. Magnetic media, electronic circuits, electrical and optical memory (both volatile and nonvolatile), and firmware are examples of logic.

Those skilled in the art will appreciate that logic may be distributed throughout one or more devices, and/or may be comprised of combinations of memory, storage media, processing circuits and controllers, other circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

Overview

A process of operating a memory circuit (e.g. for an nvS-RAM) is described in which the state of a volatile memory cell is recalled from a nonvolatile memory cell, and an output of the volatile memory cell is inverted after every other RECALL. The term "inverted recall" may be used herein to refer to embodiments of such a process. Although the preferred embodiments are described in terms of SRAM volatile cells, the techniques described herein are not necessarily limited to SRAM, and may be readily adapted to other volatile memory technologies. The term "every other" has its commonly understood meaning of either every odd turn or every even turn. In some cases the state of the volatile cell is inverted after an odd number of recalls; in other cases, depending on how the volatile cell is initialized, the inversion might occur after even recalls. Recalling of the state of the volatile memory cell may be accomplished by pulling charge from a charge storage node of the volatile cell through the nonvolatile cell. "Pulling charge" refers to driving charge out of the storage node through circuits of the nonvolatile cell, thus reducing a voltage potential on the node (i.e., "pulling down" the volatile charge storage node). For certain embodiments of a memory cell, charge may be pulled from exactly one charge storage node of the volatile cell through the nonvolatile cell, for example by pulling charge from exactly one charge storage node of the volatile cell through exactly one trigate circuit of the nonvolatile cell.

Different initializations of the volatile cell before RECALL may affect the process. For example, the volatile cell may be initialized to represent a logical one state. This state may be flipped during the RECALL process to represent a logical zero when the nonvolatile cell stores a logical one state for the volatile cell. In other words, the state of the volatile cell after RECALL ends up being inverted from the state that was STORED. In another embodiment, the volatile cell is initialized to represent an undetermined logical state, and the volatile cell state is latched to a logical zero when the nonvolatile cell stores a logical one state for the volatile cell.

Embodiments of the inverted RECALL process may operate in conventional nvRAM circuits (e.g. such as illustrated in FIG. 1). Herein "nvRAM" refers to memory circuits comprising a nonvolatile charge storage circuit coupled to a volatile charge storage circuit, capable of implementing STORE and RECALL operations. nvSRAM is one example of nvRAM.

Inverted RECALL may also be used with nvRAM circuits comprising fewer transistors than for example the circuit of FIG. 1. In one implementation only nine transistors may be needed to implement an nvRAM cell that uses inverted RECALL. An nvRAM circuit may thus include a volatile charge storage circuit and a nonvolatile charge storage circuit, logic to set, during RECALL, a logical state (i.e. "1" or "0") of the volatile charge storage circuit to the inverse of a logical state stored by the nonvolatile charge storage circuit during RECALL (i.e., inverted RECALL). The circuit may comprise logic to pull down a TRUE charge storage node of the volatile charge storage circuit to a level representing a logical "0" when the nonvolatile charge storage circuit stores a state representing a logical "1". The "TRUE" charge storage node is the node of the volatile cell whose charge represents the logical state of the cell, and is thus coupled to the bitline of the memory circuit (as opposed to being the "COMPLEMENT" charge storage node coupled to the complement bit line of the memory circuit). In the example descriptions that follow, "DT" represents the "TRUE" charge storage node, and "DC" the "COMPLEMENT" charge storage node.

In some implementations, e.g. nvSRAM, the volatile charge storage circuit may comprise a cross-coupled latch.

The cross-coupled latch may comprise two n-p transistor pairs. The nonvolatile charge storage circuit may comprise a three transistor trigate. The nonvolatile charge storage circuit may comprise exactly one trigate, the trigate comprising a silicon oxide nitride oxide SONOS transistor for nonvolatile charge storage. Herein, "exactly one trigate" means that the entire nonvolatile memory cell associated with storing the state of a particular volatile memory cell comprises one and only one trigate circuit. A "trigate circuit" comprises at least one nonvolatile storage element (which may comprise one or more transistors and elements other than transistors), a first transistor controlling a connection between the nonvolatile storage element and a power source, and a second transistor controlling a connection between the nonvolatile storage element and the volatile charge circuit. A particular example of a trigate (e.g., three transistors in series with a middle nonvolatile charge storage transistor) is used throughout the description herein, but those skilled in the art will appreciate other trigate designs may be used.

The exactly one trigate may comprise three transistors in series, a first transistor of the trigate having a non-gate connection to a charge storage node of the volatile charge storage circuit, a second transistor of the trigate having a nongate connection to a power source, and a third transistor of the trigate being a nonvolatile charge storage device. A "nongate connection" means a direct electrical connection to either a source or drain terminal of the transistor, where "direct electrical connection" means a connection that is not through another transistor or transistor-equivalent circuit.

One implementation of an nvRAM circuit may include an SRAM cell coupled to a nonvolatile charge storage circuit, the nonvolatile charge storage circuit comprising exactly one nonvolatile charge storage transistor. "Exactly one nonvolatile charge storage transistor" here means the entire nonvolatile charge storage cell associated with storing the state of a particular SRAM cell comprises one and only one nonvolatile charge storage transistor. The nvRAM may further include logic to set, during RECALL, a logical state of the SRAM to the inverse of a logical state stored by the nonvolatile charge storage circuit.

Inverted RECALL Process

Figure 2:
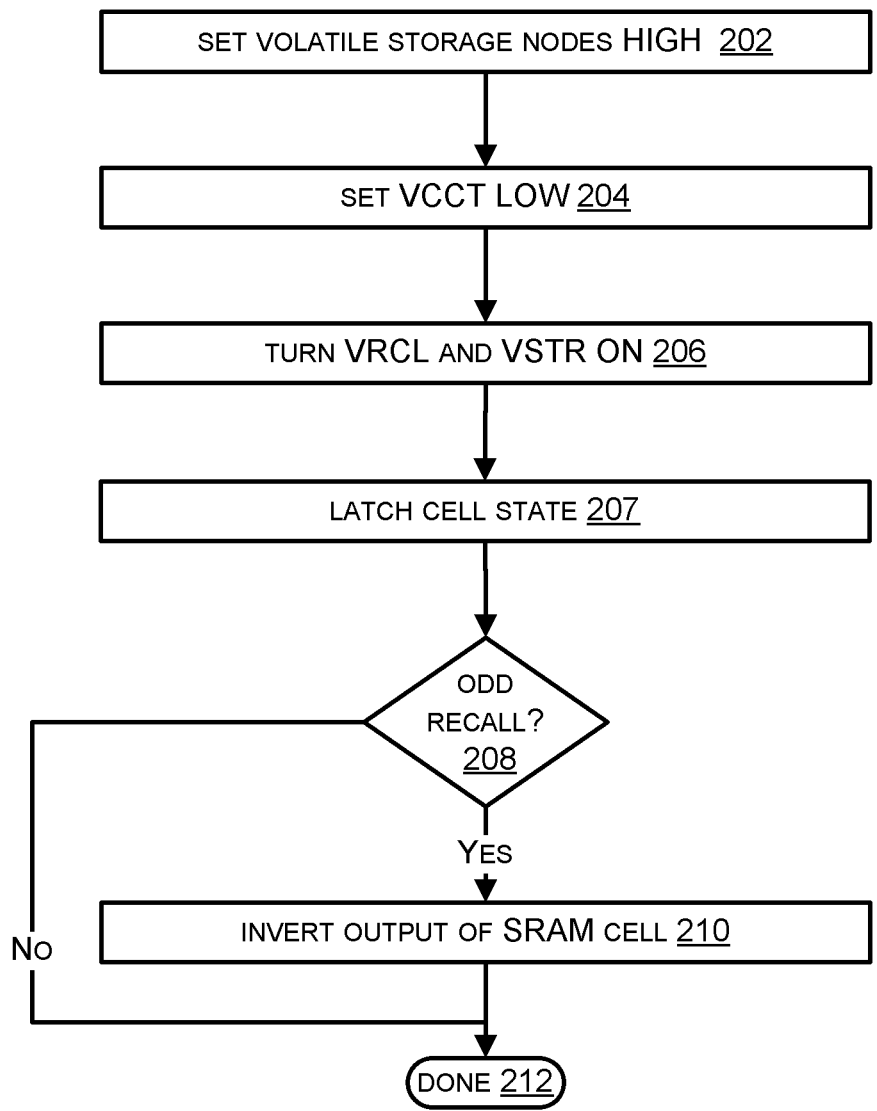
FIG. 2 is a flow chart illustration of an embodiment of an inverted RECALL process.

FIG. 2 is a flow chart illustration of an embodiment of an inverted RECALL process. This process may be applied to an nvSRAM cell such as the embodiment illustrated in FIG. 1. A RECALL in accordance with the illustrated embodiment may be simpler to implement and may work with smaller SONOS windows than conventional RECALL techniques. A SONOS window is the difference between a program threshold voltage and an erase threshold voltage for a SONOS device. The initial state of the volatile storage nodes (116 and 118) is set HIGH 202. This may be accomplished for example by setting the bitlines BT and BC HIGH and turning WL ON. VSSI and VCCI are set to VCC. VCCT is then set LOW 204. VRCL and VSTR are turned ON 206. The cell state is latched 207.

Assume the stored state of the nvSRAM 100 is "1". In this case, the last STORE will have resulted in transistor 112 being programmed and transistor 110 will be erased. Trigate 102 will thus conduct current from node DT 118 to VCCT; node DT 118 will be pulled down to LOW. Trigate 104 will not pull down node DC 116 and so node DC 116 will remain HIGH. The VSSI voltage is the reduced to zero and as a result the SRAM cell 106 will latch this state. The result is an inverted RECALL—TRUE node DT 118 is LOW, which is the inverted logical value of the cell's STORED state.

To compensate for the inverted levels of DT 118 and DC 116, the cell data may be inverted when it is read out. However, not every RECALL will result in an inverted state for the SRAM cell 106. For example, assume the SRAM cell has an inverted state due to the RECALL process described supra. The next STORE operation will preserve this inverted state in the nonvolatile cell 101. The following RECALL will invert the saved state, resulting in the volatile cell storing the correct (non-inverted) state after RECALL. Thus, the output of the SRAM cell 106 should only be inverted after every other RECALL. In general, depending on the state of the SRAM for the first STORE (e.g. one could deliberately invert the data saved to the SRAM cell 106 initially), data should be inverted when reading from or writing to the SRAM cell 106 after every other RECALL.

In the illustrated example, data is not inverted when first saved to the SRAM cell 106, so if the last RECALL was odd (the first, third, fifth etc RECALL) 208, the output of the SRAM cell 210 is inverted when read or written. The process concludes at 212. In some embodiments of inverted recall for an nvRAM cell such as the one illustrated in FIG. 1, the SRAM cell state may be initialized to DC=0 and DT=1, or vice versa. The state of the SRAM may then be caused to flip during RECALL, depending on the STORED state. When both DC and DT are initialized to 1, VSSI and VCCI do not have to be set to VCC during RECALL; they may be set to a voltage higher or lower than VCC.

Note that tracking the number of the RECALL is only one approach. One could also for example track the number of STORE operations and invert the RECALLED data after every odd number of STORES. This approach assumes an inverting RECALL follows every STORE.

Figure 3:
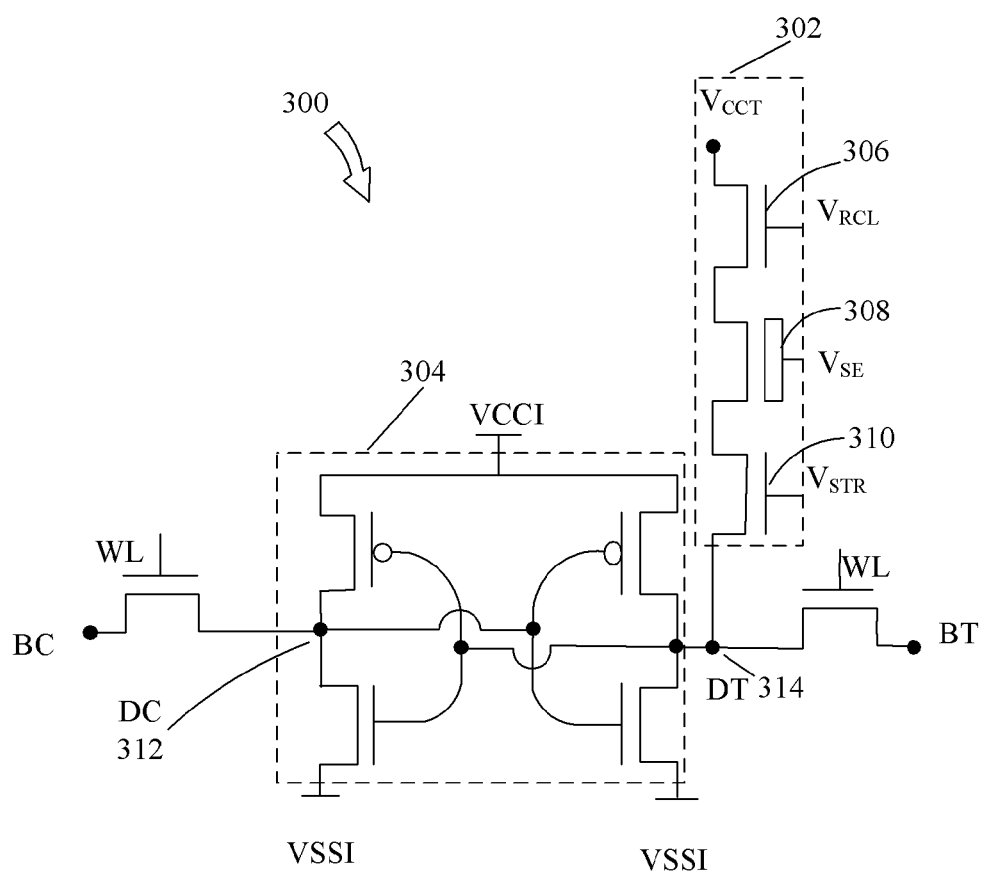
FIG. 3 is an illustration of an embodiment of a nine transistor nvSRAM memory cell.

FIG. 3 is an illustration of an embodiment of an nvSRAM memory cell. The nvSRAM memory cell comprises exactly one trigate 302 instead of the multiple trigates of conventional nvSRAM cells. The trigate 302 comprises control transistors 306 and 310 which are operated to control the electrical connection between VCCT and the nonvolatile transistor 308, and the nonvolatile transistor 308 and the volatile cell 304, respectively. The nonvolatile transistor 308 may be manufactured to more reliably and more robustly retain charge, and react to the retained charge (programming), than the nonvolatile transistors employed in circuits that use more than one trigate structure (e.g., the circuit embodiment of FIG. 1). This may be desirable because employing only a single trigate, the circuit cannot utilize the benefits of differential storage and detection.

The volatile cell 304 is in this example a cross-coupled latch as described in conjunction with FIG. 1. READ, WRITE, and STORE are accomplished in the same manner as described in conjunction with FIG. 1.

In this example RECALL is accomplished by first setting DT 314 to HIGH and DC 312 to LOW. This may be accomplished for example by setting BT HIGH and BC LOW. WL is asserted, setting DT 314 to HIGH and DC 312 to LOW. VSSI is set to a voltage below VCCI. VCCI may be set to VCC or it may be higher or lower than VCC. VCCT is then set LOW 204. VRCL and VSTR are turned ON 306.

Assume the stored state of the nvSRAM 300 is "1". In this case, the last STORE will have resulted in transistor 308 being erased. Trigate 302 will thus conduct current from node DT 314 to VCCT; node DT 314 will be pulled LOW, the latch will flip, and DC 312 will go HIGH. The SRAM cell 304 will latch this state. The result is an inverted RECALL—TRUE node DT 314 is LOW, which is the inverted logical value of the cell's STORED state. The output of the cell 300 may be inverted to compensate for the inverted RECALL, as described for example in conjunction with FIG. 2.

Assume the stored state of the nvSRAM 300 is "0". In this case, the last STORE will have resulted in transistor 308 being programmed. Trigate 302 will not conduct current from node DT 314 to VCCT; node DT 314 will remain HIGH, and DC 312 will remain LOW. The SRAM cell 304 will latch this state. The result is again an inverted RECALL—node DT 314 is HIGH, which is the inverted logical value of the cell's STORED state. The output of the cell 300 may be inverted to compensate for the inverted RECALL.

Note that the circuit operation would be substantially the same as described if the trigate 302 were coupled to DC instead of DT.

In some embodiments, the SRAM cell may be initialized to a state in which DT=0 and DC=1. In this situation operation of the RECALL process is altered; the trigate 302 will be operated to "pull up" (drive charge into) whichever volatile storage node it is coupled to, and the RECALLed state would not be inverted.

Figure 4:
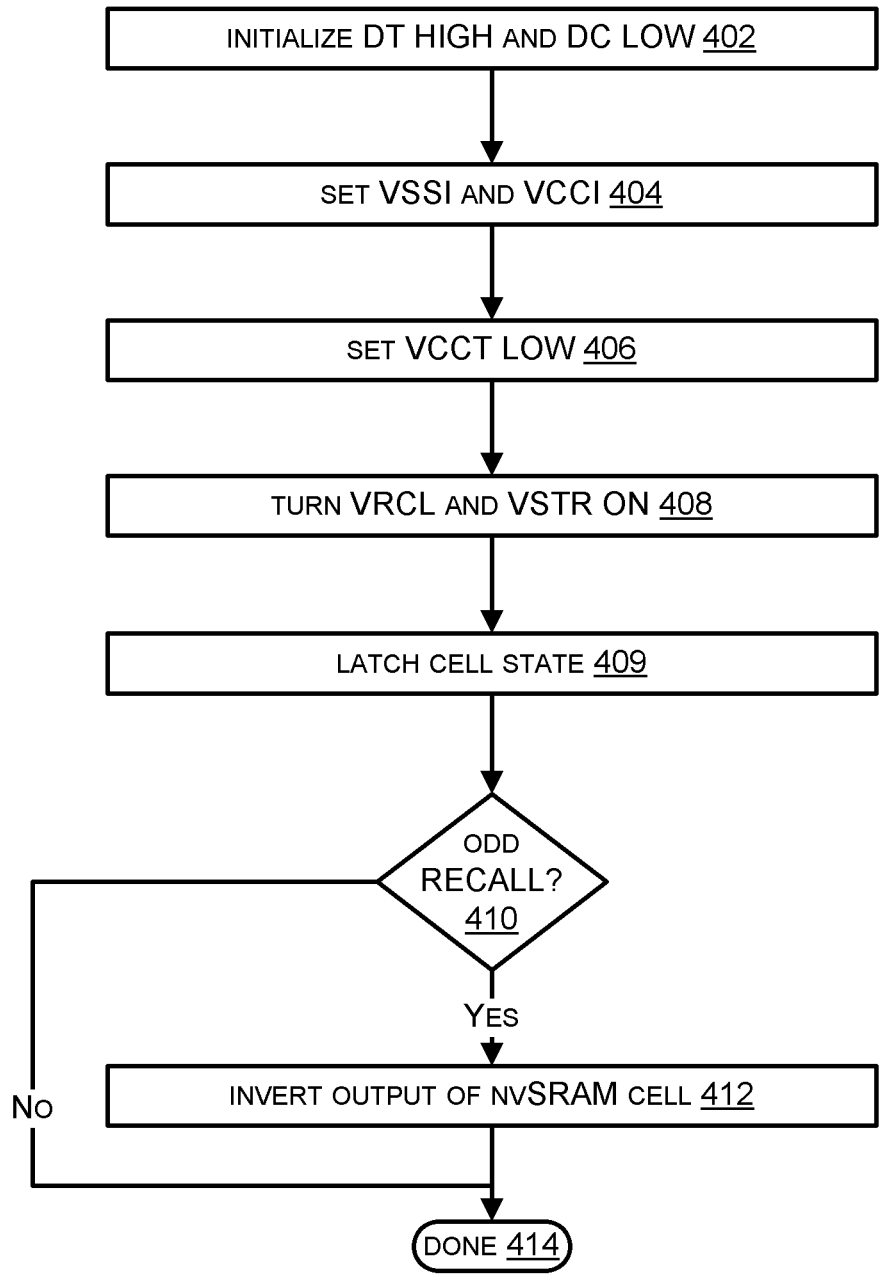
FIG. 4 is a flow chart illustrating an embodiment of an inverted RECALL process.

FIG. 4 is a flow chart illustrating an embodiment of an inverted RECALL process. This process may be employed for example in the nvSRAM cell illustrated in FIG. 3. DT and DC (the SRAM cell volatile storage nodes) are initialized to HIGH and LOW, respectively 402. VSSI and VCCI are set; VSSI is set a voltage lower than VCCI and VCCI can be any voltage higher than zero 404. VCCT is set LOW 406 and VRCL and VSTR are turned ON 408, and the cell state is latched 409. If it is an odd numbered RECALL 410, the resulting state of DT is inverted from the actual stored state. Thus, the outputs of the cell are inverted 412. The RECALL process concludes 414.

Figure 5:
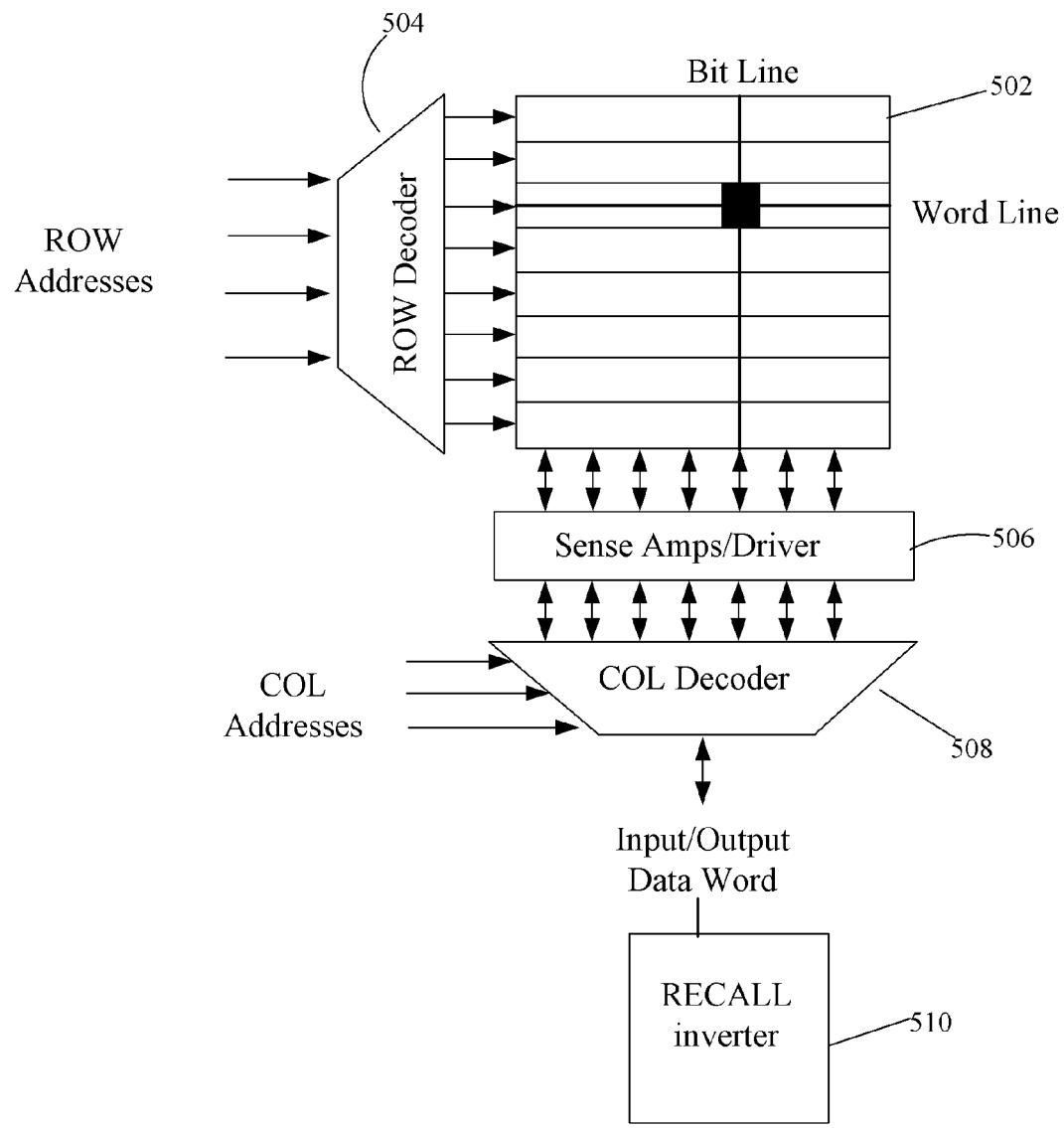
FIG. 5 is an illustration of an embodiment of a memory array and peripheral logic for reading from or writing to the memory array.

FIG. 5 is an illustration of an embodiment of a memory array and peripheral logic for reading the memory array. A row decoder 504 converts a memory address to a word line that is applied to multiple cells of a memory array 502. Cells coupled to the word line are read out to bit lines and the state of those bit lines is detected by a sense amplifier/driver 506. The sense amplifier outputs data to a column decoder 508 which selects the output data word. The output data word is applied to the selective RECALL inversion logic 510, which selectively inverts the output word depending on whether the RECALL was odd (in one embodiment) or not.

In one embodiment a flag (e.g., bit) that controls whether inversion is applied is itself stored in the memory array. The value of the bit flips (is inverted) each time it is STORED and RECALLED, and is available at an input to the RECALL inversion logic 510. Thus, the value of the bit may track whether the RECALL is odd or even, and thus whether inversion should be applied to the memory array outputs.

Figure 6:
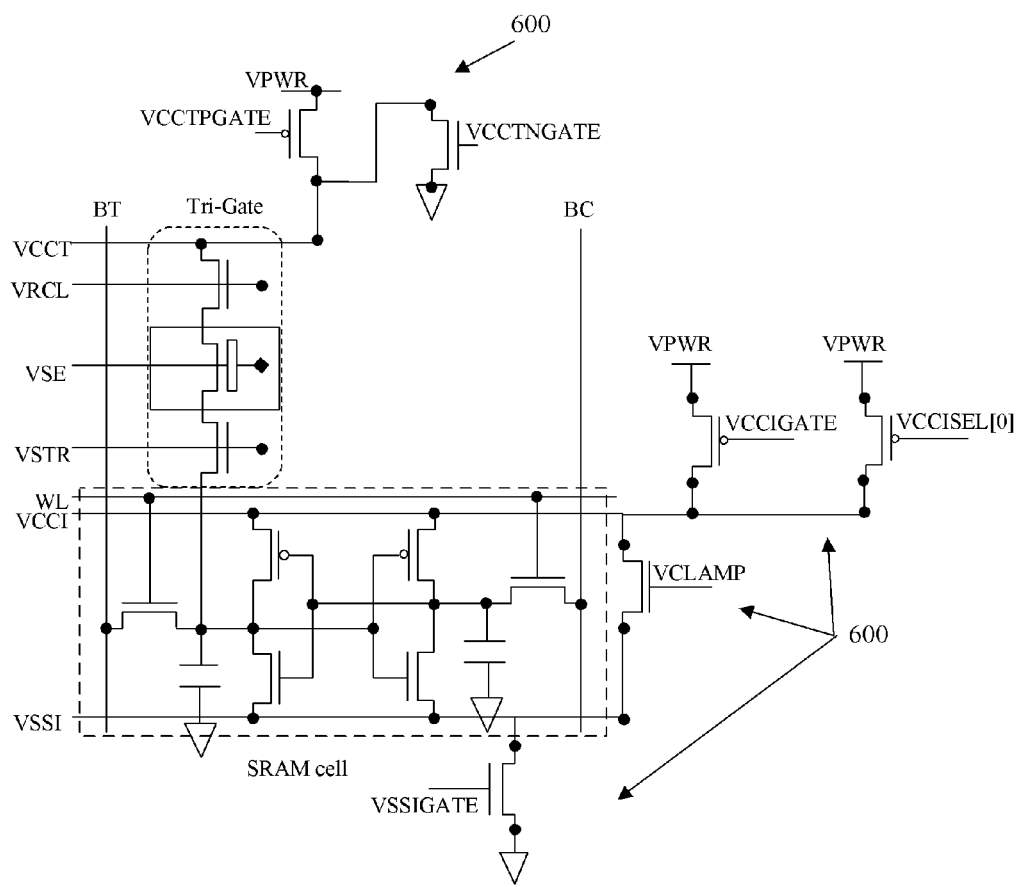
FIG. 6 is an illustration of an embodiment of an nvSRAM and logic to set a logical state of the volatile charge storage circuit to the inverse of a logical state stored by the nonvolatile charge storage circuit during RECALL (i.e., inverted RECALL).

FIG. 6 is an illustration of an embodiment of an nvSRAM and logic 600 to set a logical state (i.e. "1" or "0") of the volatile charge storage circuit to the inverse of a logical state stored by the nonvolatile charge storage circuit during RECALL (i.e., inverted RECALL). Many alternatives to the illustrated logic will be readily apparent to those skilled in the art. The illustrated logic 600 may be driven by control logic (e.g. driver, 506) and/or memory controller logic (not shown, but readily implemented in light of this disclosure). Operation of the logic 600 to set a logical state (i.e. "1" or "0") of the volatile charge storage circuit to the inverse of a logical state stored by the nonvolatile charge storage circuit during RECALL will be readily apparent in light of this disclosure to those skilled in the art, and will not be described herein.

Implementations and Alternatives

Embodiments of the memory cells and circuits described herein may be incorporated into logic distributed in one or more computing devices. The particular distribution of logic is a design decision that will vary according to implementation.

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied in read-only memories and/or media. Hardware refers to logic embodied in analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented in memory system controllers, memory arrays, Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a computing device (e.g. embedded controllers, cell phones, computers of various sizes and form factors, etc.) as well as network processing systems via a reasonable amount of experimentation.

What is claimed is:

1. A process of operating a memory circuit comprising:
   RECALLing a state of a volatile memory cell from a nonvolatile memory cell; and
   inverting an output of the volatile memory cell after every other RECALL.

2. The process of operating a memory circuit of claim 1, wherein inverting an output of the volatile memory cell after every other RECALL further comprises:
   inverting the output of the volatile cell after an odd number of RECALLs.

3. The process of operating a memory circuit of claim 1, further comprising:
   RECALLing of the state of the volatile memory cell by pulling charge through the nonvolatile cell from a charge storage node of the volatile cell.

4. The process of operating a memory circuit of claim 3, wherein RECALLing of the state of the volatile memory cell by pulling charge through the nonvolatile cell from a charge storage node of the volatile cell further comprises:
   RECALLing of the state of the volatile memory cell by pulling charge from exactly one charge storage node of the volatile cell through the nonvolatile cell.

5. The process of operating a memory circuit of claim 4, wherein RECALLing of the state of the volatile memory cell by pulling charge from exactly one charge storage node of the volatile cell through the nonvolatile cell further comprises:
   RECALLing of the state of the volatile memory cell by pulling charge from a charge storage node of the volatile cell through exactly one trigate circuit of the nonvolatile cell.

6. The process of operating a memory circuit of claim 1, further comprising:
   initializing the volatile cell to represent a logical one state; and flipping the volatile cell state to represent a logical zero when the nonvolatile cell stores a logical one state for the volatile cell.

7. The process of operating a memory circuit of claim 1, further comprising:
   initializing the volatile cell to represent an undetermined logical state; and causing the volatile cell state to latch to a logical zero when the nonvolatile cell stores a logical one state for the volatile cell.

8. An nvRAM circuit comprising:
   a volatile charge storage circuit and a nonvolatile charge storage circuit; and
   logic to set, during every other RECALL, a logical state of the volatile charge storage circuit to the inverse of a logical state stored by the nonvolatile charge storage circuit.

9. The nvRAM circuit of claim 8, wherein the logic to set, during RECALL, a logical state of the volatile charge storage circuit to the inverse of a logical state stored by the nonvolatile charge storage circuit further comprises:
   logic to pull down a TRUE charge storage node of the volatile charge storage circuit to a level representing a logical "0" when the nonvolatile charge storage circuit stores a state representing a logical "1".

10. The nvRAM circuit of claim 8, the volatile charge storage circuit comprising a cross-coupled latch.

11. The nvRAM circuit of claim 10, the cross-coupled latch comprising two n-p transistor pairs.

12. The nvRAM circuit of claim 8, the nonvolatile charge storage circuit comprising a three transistor trigate.

13. The nvRAM circuit of claim 8, the nonvolatile charge storage circuit comprising exactly one trigate, the trigate comprising a silicon oxide nitride oxide SONOS transistor for nonvolatile charge storage.

14. The nvRAM circuit of claim 13, the exactly one trigate comprising three transistors in series, a first transistor of the trigate having a non-gate connection to a charge storage node of the volatile charge storage circuit, a second transistor of the trigate having a nongate connection to a power source, and a third transistor of the trigate being a nonvolatile charge storage device.

15. An nvRAM circuit comprising:
   an SRAM cell coupled to a nonvolatile charge storage circuit, the nonvolatile charge storage circuit comprising exactly one nonvolatile charge storage transistor; and
   logic to set, during RECALL, a logical state of the SRAM cell to the inverse of a logical state stored by the nonvolatile charge storage circuit, and to invert the output of the cell after every other RECALL.

16. The nvRAM circuit of claim 15, wherein the logic to set, during RECALL, a logical state of the SRAM cell to the inverse of a logical state stored by the nonvolatile charge storage circuit further comprises:
   logic to pull down a TRUE charge storage node of the SRAM cell to a level representing a logical "0" when the nonvolatile charge storage circuit stores a state representing a logical "1".

17. The nvRAM circuit of claim 15, the SRAM cell comprising a cross-coupled latch.

18. The nvRAM circuit of claim 17, the cross-coupled latch comprising two n-p transistor pairs.

19. The nvRAM circuit of claim 15, the nonvolatile charge storage circuit comprising a trigate.

20. The nvRAM circuit of claim 15, the nonvolatile charge storage circuit comprising exactly one trigate, the trigate comprising exactly one silicon oxide nitride oxide SONOS transistor for nonvolatile charge storage.

* * * * *